(12) United States Patent
Nishiyama (10) Patent No.: US 10,285,314 B2
(45) Date of Patent: May 7, 2019

(54) COMPONENT MOUNTER

(71) Applicant: FUJI CORPORATION, Chiryu-shi (JP)

(72) Inventor: Satoru Nishiyama, Nagoya (JP)

(73) Assignee: FUJI CORPORATION, Chiryu-shi (JP)

( * ) Notice: Subject to any disclaimer, the term of this patent is extended or adjusted under 35 U.S.C. 154(b) by 164 days.

(21) Appl. No.: 15/522,025

(22) PCT Filed: Oct. 30, 2014

(86) PCT No.: PCT/JP2014/078978
§ 371 (c)(1),
(2) Date: Apr. 26, 2017

(87) PCT Pub. No.: WO2016/067427
PCT Pub. Date: May 6, 2016

(65) Prior Publication Data
US 2017/0318714 A1  Nov. 2, 2017

(51) Int. Cl.
*H05K 13/04* (2006.01)
*G05B 15/02* (2006.01)
*H05K 13/00* (2006.01)

(52) U.S. Cl.
CPC ......... *H05K 13/0408* (2013.01); *G05B 15/02* (2013.01); *H05K 13/0015* (2013.01); *H05K 13/041* (2018.08); *H05K 13/0413* (2013.01)

(58) Field of Classification Search
CPC .... G05B 15/02; H05K 13/0015; H05K 13/04; H05K 13/0408; H05K 13/041; H05K 13/0413
See application file for complete search history.

(56) References Cited

U.S. PATENT DOCUMENTS 6,161,277 A * 12/2000 Asai ............... H05K 13/08
29/740
6,678,944 B1 * 1/2004 Kawada ......... H05K 13/0452
29/740
(Continued)

FOREIGN PATENT DOCUMENTS

JP  2006-261325 A  9/2006

OTHER PUBLICATIONS

International Search Report dated Feb. 3, 2015, in PCT/JP2014/078978, filed Oct. 30, 2014.

*Primary Examiner* — Kenneth M Lo
*Assistant Examiner* — Michael J Huntley
(74) *Attorney, Agent, or Firm* — Oblon, McClelland, Maier & Neustadt, L.L.P.

(57) ABSTRACT

A component mounter includes a component transfer device, a tool station, and a control device. The component transfer device is provided with a head main body, and a tool holding device configured to hold a nozzle tool and provided to be raisable and lowerable with respect to the head main body and rotatable around a rotation axis line. The tool station is configured to be able to store an exchange-use nozzle tool at multiple different storage angles. The control device of the component mounter includes an angle acquiring section that acquires the storage angle of the exchange-use nozzle tool in the tool station, and an exchange control section that, during the nozzle tool exchange processing, rotates the tool holding device based on the storage angle of the nozzle tool, and performs angle alignment of the nozzle tool with respect to the head main body.

6 Claims, 8 Drawing Sheets

(56) References Cited

U.S. PATENT DOCUMENTS

| | | | | |
|---|---|---|---|---|
| 2006/0085973 A1* | 4/2006 | Kodama | ................ | H05K 13/04 |
| | | | | 29/740 |
| 2006/0207090 A1* | 9/2006 | Kawada | ............. | H05K 13/0452 |
| | | | | 29/832 |
| 2012/0151756 A1* | 6/2012 | Amano | .............. | H05K 13/0413 |
| | | | | 29/720 |
| 2012/0262626 A1* | 10/2012 | Ikeda | ................. | H05K 13/0015 |
| | | | | 348/373 |
| 2015/0013154 A1* | 1/2015 | Imoto | ................ | G05B 19/4015 |
| | | | | 29/833 |

* cited by examiner

COMPONENT MOUNTER

TECHNICAL FIELD

The present application relates to a component mounter capable of automatically exchanging a nozzle tool to which a nozzle is attached.

BACKGROUND ART

A component mounter picks up an electronic component at a supply position using a suction nozzle and mounts the electronic component at specified coordinates (mounting position) on a circuit board. Among such component mounters, as shown in patent literature 1, there are those that hold a nozzle tool to which a suction nozzle is attached such that exchange of the nozzle tool is possible. An exchange-use nozzle tool is stored in a tool station provided inside the component mounter. The component mounter is configured to perform automatic exchange of a nozzle tool that corresponds to the type and so on of the electronic component to be mounted by controlling operation of a component transfer device that holds the nozzle tool.

Such a component transfer device is provided with a driving device that rotates, raises, and lowers the suction nozzle during mounting processing of the electronic component. During exchange processing of the nozzle tool, depending on the configuration of the above driving device and the configuration of the nozzle tool, it is necessary to perform interference prevention between the driving device and the auto-tool, and positional alignment of the mounting portion. Also, the nozzle station stores a nozzle tool at a predetermined storage angle. Therefore, whenever performing nozzle tool exchange processing, the component mounter performs angle alignment of the nozzle tool with the nozzle station and the main body of the component transfer device.

CITATION LIST

Patent Literature

Patent literature 1: JP-A-2006-261325

SUMMARY

The operation time required for angle alignment of the nozzle tool during exchange processing depends on the rotation angle. Therefore, for a component mounter capable of nozzle tool exchange, there is a demand to improve the efficiency of exchange processing.

The present disclosure takes account of the above circumstances and an object thereof is to provide a component mounter that improves the efficiency of nozzle tool exchange.

The component mounter according to claim 1 is provided with: a component transfer device configured to detachably hold a nozzle tool to which a suction nozzle is attached, move the nozzle tool, and transfer an electronic component held by the suction nozzle to a mounting position on a circuit board; a tool station configured to store the exchange-use nozzle tool; and a control device configured to control operation of the component transfer device and perform mounting processing of the electronic component and exchange processing of the nozzle tool. The component transfer device includes a head main body, and a tool holding device configured to hold the nozzle tool and provided to be raisable and lowerable with respect to the head main body and rotatable around a rotation axis line. The tool station is configured to be able to store the exchange-use nozzle tool at multiple different storage angles. The control device is provided with an angle acquiring section configured to acquire the storage angle of the exchange-use nozzle tool in the tool station, and an exchange control section configured to, during the exchange processing of the nozzle tool, raise and lower the tool holding device such that the exchange-use nozzle tool stored in the tool station is held by the tool holding device, rotate the tool holding device based on the storage angle of the nozzle tool, and perform angle alignment of the nozzle tool with respect to the head main body.

ADVANTAGEOUS EFFECTS

According to such a configuration, the tool station is configured to be capable of storing the exchange-use nozzle tool at multiple different storage angles. Thus, the degree of freedom of setting the storage angle of the exchange-use nozzle tool stored in the tool station is improved. Also, during exchange processing for exchanging the exchange-use nozzle tool stored in the tool station at any of the storage angles from among the multiple different storage angles, the component mounter performs angle alignment of the nozzle tool with respect to the head main body based on the storage angle of the exchange-use nozzle tool. Thus, it is possible to perform highly effective nozzle tool exchange processing appropriate to the tool station.

Also, the tool station is able to store the exchange-use nozzle tool at multiple different storage angles. Therefore, it is possible to hold the nozzle tool in the tool station at a storage angle that corresponds to the holding angle of the nozzle tool that has been angularly aligned with respect to the head main body. By this, during nozzle tool exchange processing, it is possible to make the rotation angle of the nozzle tool required for angle alignment of the nozzle tool zero or a small angle. By this, efficiency of nozzle tool exchange processing is improved.

DESCRIPTION OF EMBODIMENTS

An embodiment of the present disclosure of a component mounter is described below with reference to the drawings.

A component mounter picks up an electronic component at a supply position using a suction nozzle and mounts the electronic component at specified coordinates (mounting position) on a circuit board.

Embodiment

1. Overall Configuration of Component Mounter 1

Figure 1:
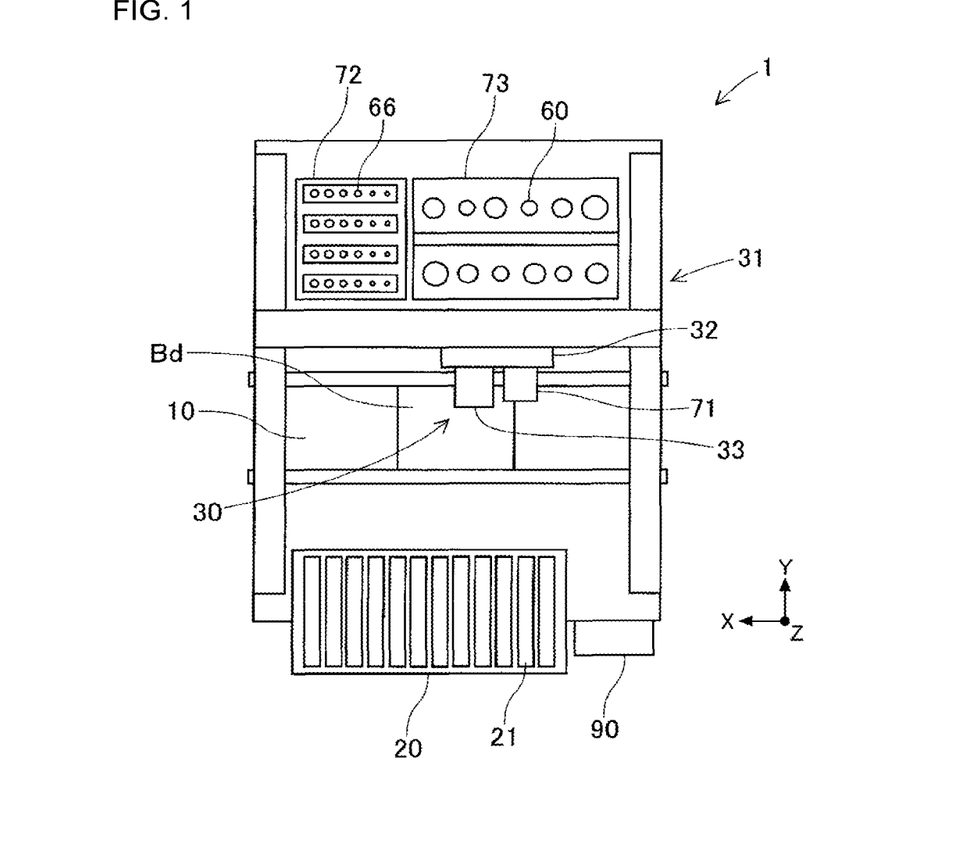
FIG. 1 is a plan view showing an entire view of a component mounter of an embodiment.

As shown in FIG. 1, component mounter 1 is provided with board conveyance device 10, component supply device 20, component transfer device 30, board camera 71, nozzle station 72, tool station 73, and control device 90. In the descriptions below, the horizontal width direction of component mounter 1 (left-right direction in FIG. 1) is the X-axis direction, the horizontal lengthwise direction of component mounter 1 (up-down direction in FIG. 1) is the Y-axis direction, and the direction perpendicular to the X axis and Y axis (perpendicular to the page in FIG. 1) is the Z-axis direction.

Board conveyance device 10 is configured from a belt conveyor or the like and consecutively conveys boards Bd in a conveyance direction. Board conveyance device 10 positions board Bd at a specified position inside component mounter 1. Then, after mounting processing has been performed by component mounter 1, board conveyance device 10 unloads board Bd from component mounter 1.

Component supply device 20 supplies electronics components that are mounted on board Bd. Component supply device 20 includes multiple slots arranged lined up in the X-axis direction. Feeders 21 are removably set in each of the multiple slots. Component supply device 20 supplies electronic components to a removal section positioned at the leading end of feeder 21 (the upper side in FIG. 1) by feeder 21 indexing carrier tape.

Component transfer device 30 is configured to move in the X-axis direction and the Y-axis direction. Component transfer device 30 is arranged from the rear side in the lengthwise direction of component mounter 1 (the upper side in FIG. 1) to above component supply device 20 at the front of component mounter 1. Component transfer device 30 is provided with XY robot 31, moving body 32, and head unit 33. XY robot 31 is configured to move moving body 32 in the XY-axis directions using a linear motion mechanism. Head unit 33 is detachably attached to moving body 32 of XY robot 31.

Figure 2:
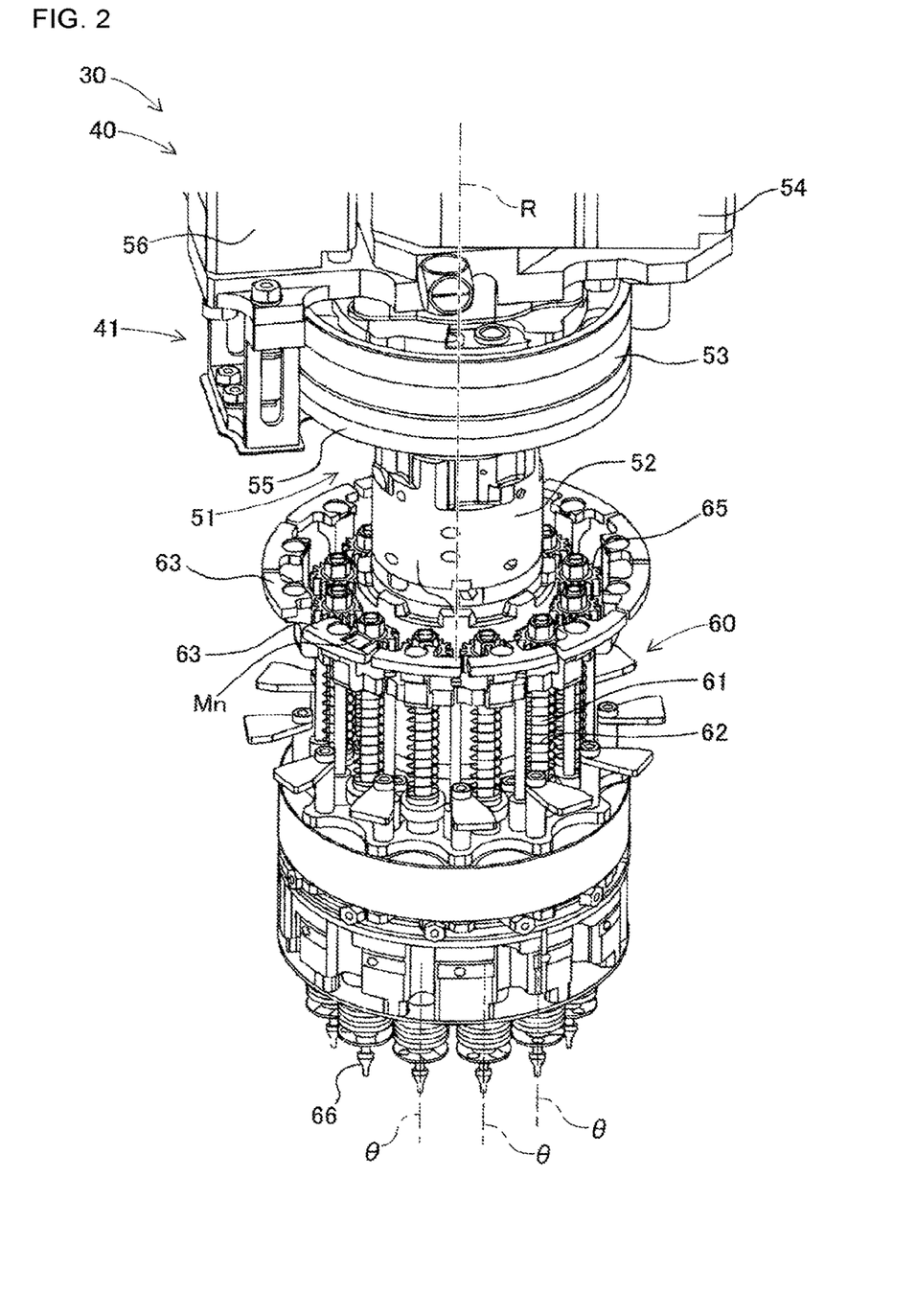
FIG. 2 is a perspective view of a nozzle tool in a state removed from the head main body of a head unit.

Head unit 33 supports each suction nozzle 66 so as to be rotatable around an R axis parallel to the Z axis and able to be raised/lowered (refer to FIG. 2). The height position and angle of each suction nozzle 66 with respect to head unit 33 and the state of supply of negative pressure to each suction nozzle is controlled. Suction nozzle 66, by being supplied with negative pressure, picks up and holds an electronic component supplied to a removal section of feeder 21. Component transfer device 30 moves the electronic component held by suction nozzle 66 to a mounting position on the board by operation of XY robot 31 and head unit 33. The detailed configuration of component transfer device 30 is described later.

Board camera 71 is fixed to moving body 32 of component transfer device 30 such that the light axis faces down in the Z-axis direction. Board camera 71 is configured to be able to image the board Bd when moving body 32 has been moved above board Bd positioned by the board conveyance device. The image of board Bd acquired by board camera 71 is, for example, during electronic component mounting processing, used for recognizing the positional state of board Bd positioned by board conveyance device 10.

Nozzle station 72 is a storage location for suction nozzles 66. Multiple types of exchange-use suction nozzles 66 are stored in nozzle station 72. Tool station 73 is a storage location for nozzle tools 60. Exchange-use nozzle tools 60 are each stored in the multiple slots 80 provided in tool station 73. Nozzle station 72 and tool station 73 are arranged inside component mounter 1 in a region in which component transfer device 30 can move. Therefore, the configuration of component mounter 1 is such that suction nozzle 66 and nozzle tool 60 can be exchanged automatically based on the type and so on of the electronic component to be mounted.

Further, each slot 80 of tool station 73 is configured to be able to store exchange-use nozzle tool 60 at multiple different storage angles. Here, "storage angle" means the angle with respect to the rotation axis line of nozzle tool 60 stored in tool station 73. The storage angle is, for example, an angle at which a reference position with respect to the rotation axis line set on nozzle tool 60 is rotated around the rotation axis line with respect to a reference position set on tool station 73. In the present embodiment, each slot 80 of tool station 73 is configured such that exchange-use nozzle tool 60 is able to be stored at two different storage angles, An1 and An2.

Figure 7:
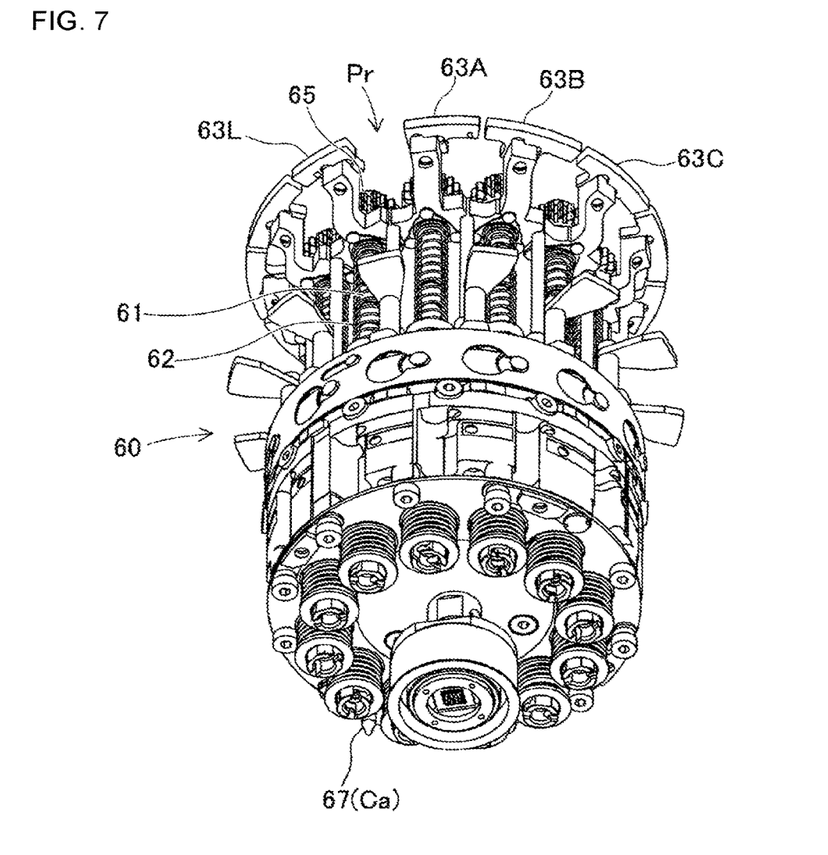
FIG. 7 is a perspective view of the lower surface of the nozzle tool.
Figure 8:
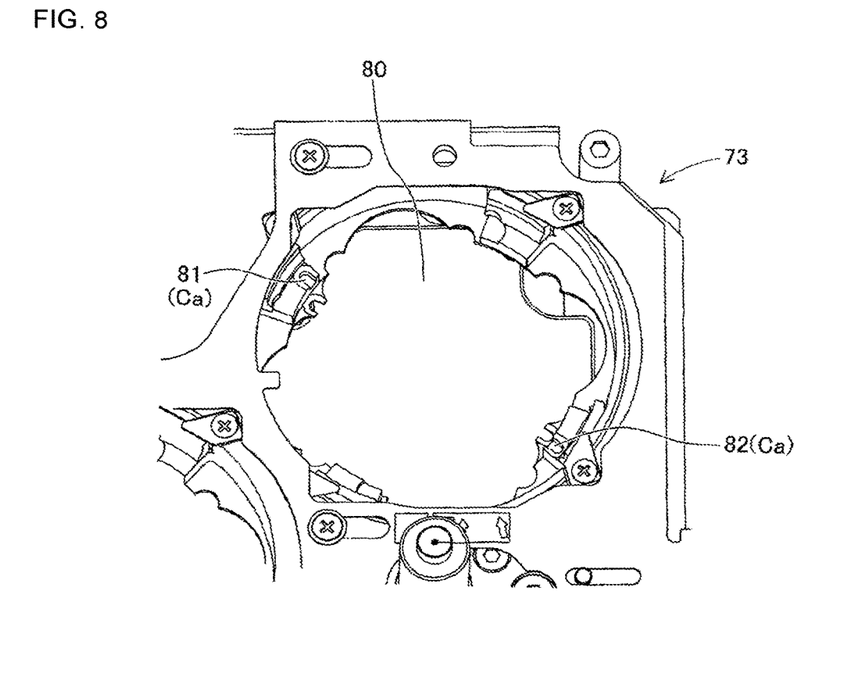
FIG. 8 is a perspective view of a slot of the tool station.

Specifically, as shown in FIG. 8, slots 80 is provided with multiple hole sections 81 and 82 arranged at different positions on the rotation axis line of nozzle tool 60 stored in tool station 73. Hole section 81 is a pin hole into which pin section 67 (refer to FIG. 7) of nozzle tool 60 is inserted. In the present embodiment, hole sections 81 and 82 are formed on the lower section slot 80 at positions deviated by 180 degrees in the circumference direction. According to such a configuration, nozzle tool 60 is stored at storage angle An1 when pin section 67 is inserted into first hole section 81, and is stored at storage angle An2 when pin section 67 is inserted into second hole section 82.

Control device 90 is configured mainly from a CPU, various types of memory, and control circuits. Control device 90 includes a storage device that stores mounting data for operating component mounter 1, and image data transmitted from a component camera, which is not shown, and board camera 71. Control device 90 performs image processing using the acquired image data. Control device 90 corrects operation of component supply device 20 and component transfer device 30 and so on based on the state of the electronic component and circuit board Bd recognized by the image processing. By this, control device 90 controls electronic component mounting processing.

Also, control device 90 controls exchange processing for automatically exchanging suction nozzle 66 and nozzle tool 60 based on the above mounting data and state of suction nozzle 66 and so on. Specifically, control device 90 performs exchange processing to change suction nozzle 66 or nozzle tool 60 based on the type of electronic component to be mounted, or to change suction nozzle 66 for a new suction nozzle 66 when an exchange period has been reached. The detailed configuration of control device 90 and details of exchange processing of nozzle tool 60 are described below.

2. Detailed Configuration of Component Transfer Device 30

As described above, component transfer device 30 is provided with head unit 33 detachably fixed to moving body 32. In the present embodiment, head unit 33 is a type that exchangably holds nozzle tool 60 to which is attached suction nozzle 66. Head unit 33 includes mounting head 40 and nozzle tool 60.

2-1. Mounting Head 40

Mounting head 40 is a driving device configured from head main body 41 and tool holding device 51. Various connectors (not shown) and a clamp mechanism for securing head unit 33 to moving body 32 are provided on head main body 41. Tool holding device 51 is a device that holds nozzle tool 60 and that is provided to be raisable and lowerable and rotatable around a rotation axis line with respect to head main body 41.

Figure 3:
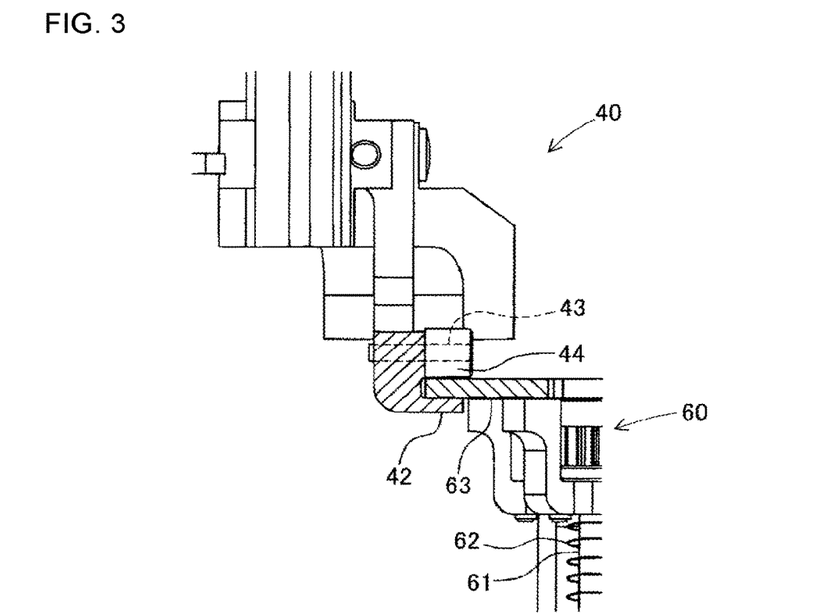
FIG. 3 is a front view showing the configuration of a main configuration section of a nozzle operating mechanism.

In detail, a nozzle operating mechanism that raises and lowers suction nozzle 66 attached to nozzle tool 60 is provided on head main body 41. The nozzle operating mechanism operates a linear action mechanism such as a ball screw mechanism by driving a Z-axis motor (not shown) fixed to head main body 41. As shown in FIG. 3, this direct action mechanism is provided with nozzle lever 42, roller shaft 43, and roller 44.

Nozzle lever 42 is able to engage from below with lever engaging member 63 of nozzle tool 60, described below, and is formed with an L-shaped cross section. Roller shaft 43 is a cylindrical member extending in a horizontal direction and is fixed to nozzle lever 42. Roller 44 is provided to be rotatable on the outer circumferential surface of roller shaft 43. Roller 44 is arranged such that there is a specified gap between the outer circumferential surface of roller 44 and the engaging surface of nozzle lever 42 positioned below.

The nozzle operating mechanism of head main body 41 configured as described raises and lowers nozzle lever 42 and roller 44 with lever engaging member 63 of nozzle tool 60 in a state held in an engaging groove formed by nozzle lever 42 and roller 44. By this, the nozzle operating mechanism raises and lowers suction nozzle 66 attached to nozzle holder 61 in the Z-axis direction via nozzle holder 61 on which lever engaging member 63 is formed.

As shown in FIG. 2, tool holding device 51 includes indexing shaft 52 rotatably supported on head main body 41. Indexing shaft 52 is connected to R-axis motor 54 via R-axis driven gear 53 (the teeth surface are not shown in FIG. 2) fixed as one to an upper section of indexing shaft 52. Indexing shaft 52 changes the rotation angle by a specified angle each movement based on operation of R-axis motor 54. Indexing shaft 52 detachably holds nozzle tool 60 using a clamp mechanism (not shown) provided on a lower end section of indexing shaft 52.

θ-axis driven gear 55 (shown in FIG. 2 without teeth) with a round shape is arranged on the outer circumferential surface of indexing shaft 52. θ-axis driven gear 55 is rotatably supported on indexing shaft 52, and rotates around the R-axis due to the driving of θ-axis motor 56. A clutch section (not shown) that connects to θ-axis cylindrical gear 64, which is described later, is formed on a lower end section of θ-axis driven gear 55.

2-2. Nozzle Tool 60

Nozzle tool 60 detachably holds multiple suction nozzles 66. However, nozzle tool 60 includes a type that holds a single suction nozzle 67. Each nozzle tool 60 is suitably exchanged based on the type of electronic component and mounting processing to be performed. Nozzle tool 60 of the present embodiment, in a state being held by tool holding device 51, holds twelve suction nozzles 66 at even intervals in a circumferential direction on a circumference with a center the same as the R axis.

Specifically, as shown in FIG. 2, nozzle tool 60 holds multiple nozzle holders 61 to be rotatable and slidable in the Z-axis direction. Nozzle holder 61 is biased upwards with respect to the main body of nozzle tool 60 by the elastic force of spring 62. By this, nozzle holder 61, in a usual state of not being subjected to an external force, is positioned at an upper limit.

Figure 4:
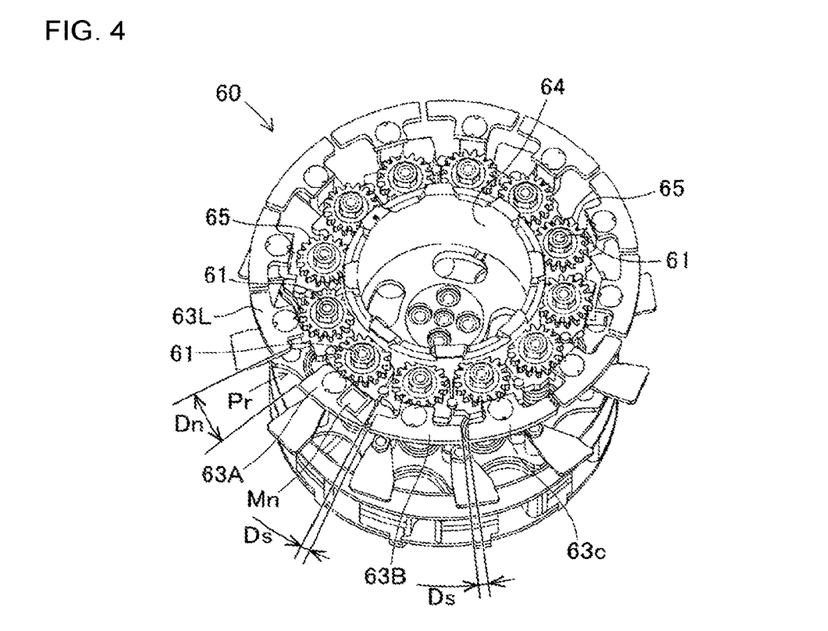
FIG. 4 is a perspective view of the upper surface of the nozzle tool.

Lever engaging member 63 with an arc shape when viewed from the rotation axis line direction of nozzle tool 60 is provided on an upper end section of nozzle holder 61. In a state with all nozzle holders 61 positioned at the upper limit, lever engaging member 63 fixed to each nozzle holder 61, as shown in FIGS. 2 to 4, is arranged along an imaginary circle with the rotation axis of nozzle tool 60 at the center. Further, lever engaging member 63 is formed to be engagable with an engaging groove formed from roller 44 and nozzle lever 42 of head main body 41.

Figure 5:
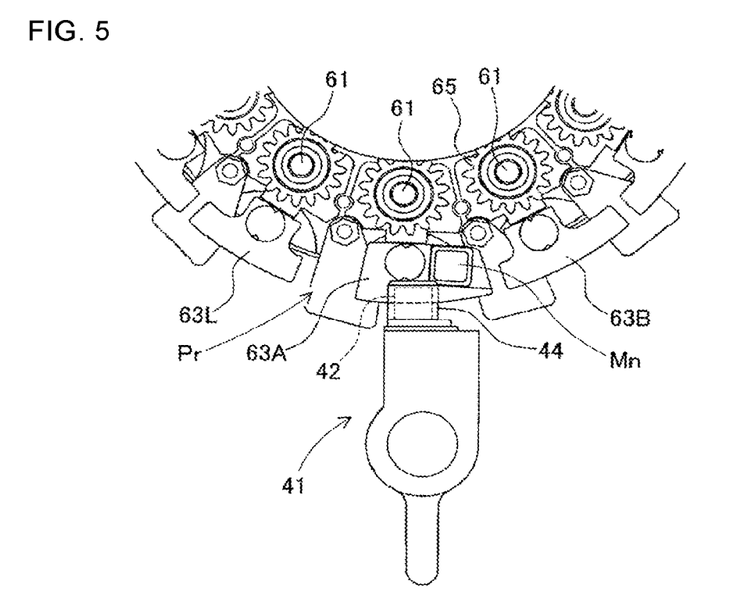
FIG. 5 is a plan view showing the relationship between the nozzle operating mechanism and the nozzle tool during mounting processing.

Below, in the present embodiment, as shown in FIG. 4, the twelve lever engaging members 63 fixed to each of the twelve nozzle holders 61 are referred to as first lever engaging member 63A, then subsequently in order in a circumferential direction, second lever engaging member 63B, third lever engaging member 63C, . . . , and twelfth lever engaging member 63L. Here, the interval Ds in the circumferential direction between adjacent lever engaging members 63 is set to be narrower than the width in the circumferential direction of roller 44 of head main body 41, except for the interval Dn between first lever engaging member 63A and twelfth lever engaging member 63L. By this, as shown in FIG. 5, roller 44 is configured to be rotatable without falling between adjacent lever engaging members 63 when nozzle tool 60 is rotated.

Figure 6:
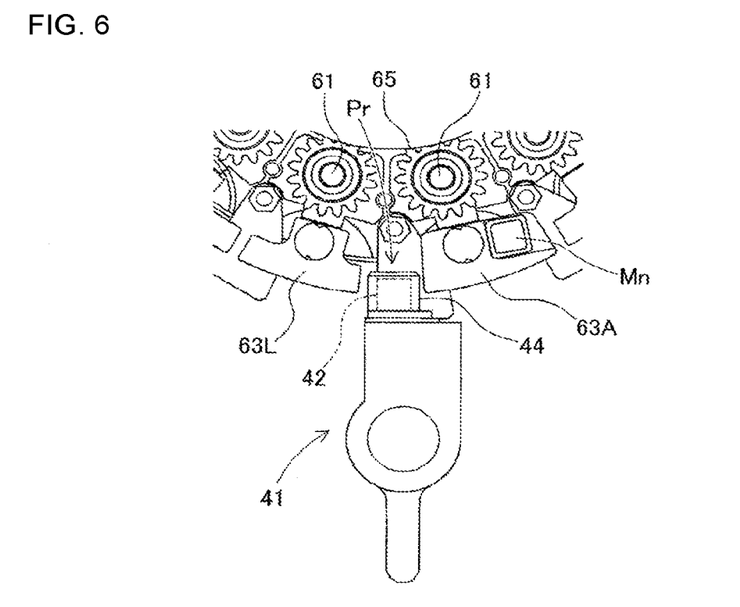
FIG. 6 is a plan view showing the relationship between the nozzle operating mechanism and the nozzle tool during exchange processing.

On the other hand, as shown in FIG. 4, interval Dn between first lever engaging member 63A and twelfth lever engaging member 63L is set to be wider than the circumferential direction width of nozzle lever 42 of head main body 41. Therefore, as shown in FIG. 6, passage Pr through which nozzle lever 42 can pass in a vertical direction is formed between first lever engaging member 63A and twelfth lever engaging member 63L. According to head main body 41 and nozzle tool 60 configured as described above, during exchange processing of nozzle tool 60, to prevent interference between nozzle lever 42 and nozzle tool 60, it is necessary to align the angle of nozzle tool 60 with respect to head main body 41 such that nozzle lever 42 passes through passage Pr.

Also, information code Mn is provided on an upper surface of first lever engaging member 63A. This information code has information including an identification number and type of nozzle tool 60, and is used in recognition processing of nozzle tool 60. Here, recognition processing of nozzle tool 60 is processing for acquiring the identification number and type of nozzle tool 60 stored in tool station 73, and linking the information to the position (for example, the number of slot 80 in which nozzle tool 60 is stored) in tool station 73. Any one or combination of barcode, 2D code, character string, pattern, or shading may be used as an information code. In the present embodiment, a 2D code configured from a matrix of multiple individual cells is used as an information code.

Nozzle tool 60 includes θ-axis cylindrical gear 64 held with respect to a main body section that holds the multiple nozzle holders 61 in a manner rotatable around the rotation axis line. θ-axis cylindrical gear 64 is formed as a cylinder. The internal diameter of θ-axis cylindrical gear 64 is set to be smaller than the outer diameter of indexing shaft 52 of tool holding device 51. Nozzle tool 60 is held by the clamp mechanism of indexing shaft 52 passing through the inside of θ-axis cylindrical gear 64, and is raised and lowered by tool holding device 51.

With θ-axis cylindrical gear 64, in a state in which nozzle tool 60 is positioned at the upper limit, a clutch section formed on an upper section of θ-axis cylindrical gear 64 is connected to a clutch section formed on θ-axis driven gear 55. In this manner, θ-axis cylindrical gear 64 is configured to be rotatable as one with θ-axis driven gear 55, so as to be rotated around the R axis by the driving of θ-axis motor 56.

Outer teeth are formed on the outer circumferential surface of θ-axis cylindrical axis 64 (the teeth are omitted in FIGS. 2 and 4).

Nozzle gear 65 that rotates as one with nozzle holder 61 around the θ-axis is provided on an upper end section of nozzle holder 61. Nozzle gear 65 is slidably engagable in the rotation axis line direction with the outer teeth of θ-axis cylindrical gear 64. Suction nozzle 66 is detachably held on a lower end section of nozzle holder 61. Suction nozzle 66 picks up an electronic component using negative pressure supplied via an air passage from a negative air supply device, which is not shown.

According to such a configuration, when θ-axis motor 56 is driven, θ-axis driven gear 55 and θ-axis cylindrical 64 rotate around the R axis. Based on this, each nozzle holder 61, each nozzle gear 65, and each suction nozzle 66 rotate (spin) around their respective axes (θ axis). Further, each suction nozzle 66 is sequentially rotated to a specified angle position around the R axis by nozzle tool 60 rotating via indexing shaft 52 based on the driving of R-axis motor 54.

Also, as shown in FIG. 7, nozzle tool 60 includes pin section 67 extending in the rotation axis line direction from the bottom surface of the main body section that holds the multiple nozzle holders 61. In the present embodiment, a tapered guiding surface, for which the external diameter gets smaller the further down in the rotation axis line direction, is formed on the leading end section of pin section 67. When nozzle tool 60 is stored in tool station 73, pin section 67 is selectively inserted into one of the hole sections 81 and 82 provided on the bottom surface of a corresponding slot 80. By this, nozzle tool 60 is stored in nozzle station 73 at one of storage angles An1 or An2.

In the present embodiment, pin section 67 of nozzle tool 60 and hole sections 81 and 82 of tool station 73 configure angle determining mechanism Ca of component mounter 1. Angle determining mechanism Ca allows nozzle tool 60 stored in tool station 73 to be raised and lowered, and regulates the rotation around the rotation axis line of nozzle tool 60 with respect to tool station 73. Angle determining mechanism Ca allows nozzle tool 60 to be stored in tool station 73 at predetermined multiple types of storage angles, An1 and An2.

In the present embodiment, the two types of storage angles, An1 and An2, are set in advance by arranging the two hole sections 81 and 82. That is, by pin section 67 being selectively inserted into one of the multiple hole sections 81 and 82, the rotation of nozzle tool 60 around the rotation axis line with respect to tool station 73 is regulated to storage angles An1 and An2 that correspond to the positional relationship between pin section 67 and hole sections 81 and 82.

Specifically, pin section 67 inserted into hole sections 81 and 82, in a case in which stored nozzle tool 60 is subject to an external force in the rotation direction, regulates the rotation of nozzle tool 60 by engaging with the internal circumferential surface of hole sections 81 and 82. Here, pin section 67 is not engaged in the rotation axis line direction with respect to hole sections 81 and 82, and angle determining mechanism Ca allows the raising and lowering of nozzle tool 60.

3. Detailed Configuration of Control Device 90

Figure 9:
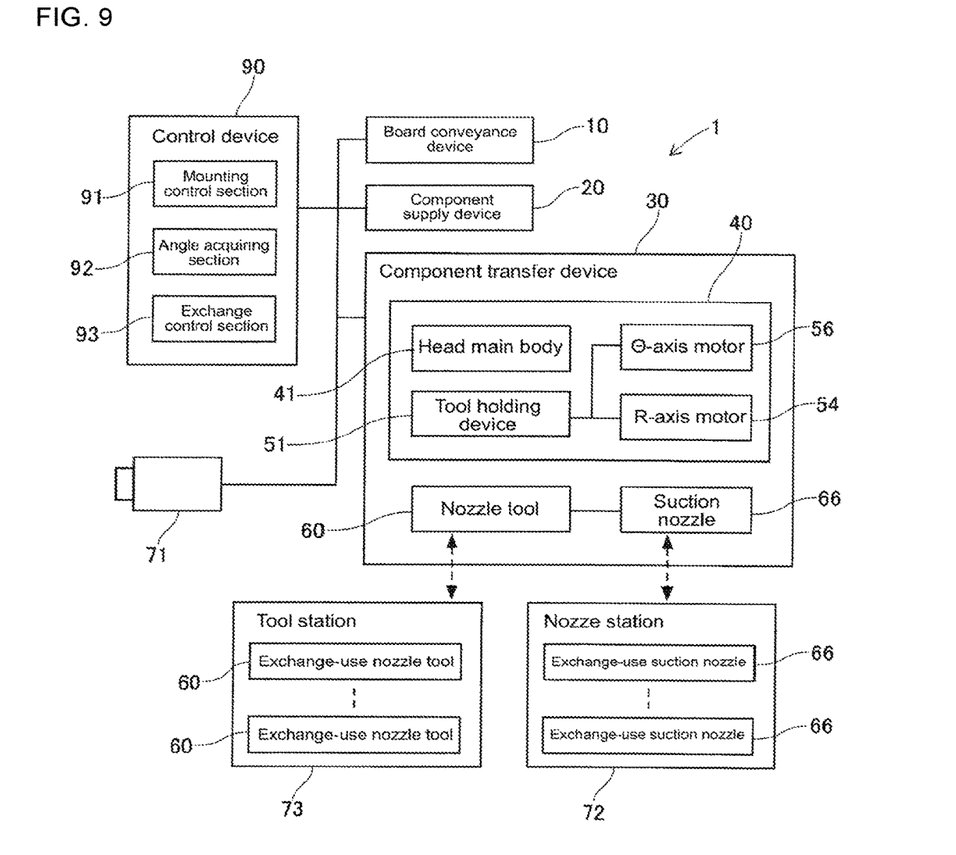
FIG. 9 is a block diagram showing the component mounter.

An input-output interface is connected to control device 90 via a bus, which is not shown. A motor control circuit, an imaging control circuit, and the like are connected to this input-output interface. As shown in FIG. 9, control device 90 is provided with mounting control section 91, angle acquiring section 92, and exchange control section 93.

Mounting control section 91 controls the position and operation of head unit 33 via motor control circuits. Specifically, mounting control section 91, during electronic component mounting processing, inputs information outputted from various sensors, and results of various recognition processing. Then, mounting control section 91 sends control signals to the motor control circuits based on mounting data memorized in a memory device, information from the various sensors, and the results of image processing and recognition processing. By this, control section 91 controls the position and rotation angle around the θ axis of suction nozzles 66 held on nozzle tool 60.

Further, recognition processing of the positioning state of board Bd is included in the above recognition processing. The above recognition processing is performed by image processing board marks provided at specified positions on board Bd using an image of board Bd acquired by board camera provided on component transfer device 30. Mounting control section 91 recognizes the positioning state of board Bd based on the control position of XY robot when board Bd was imaged and the position of the board marks in the captured image.

Angle acquiring section 92 acquires the storage angle of exchange-use nozzle tool 60 in tool station 73. Various methods may be employed for acquiring the storage angle. In the present embodiment, angle acquiring section 92 acquires the storage angle of nozzle tool 60 based on an image of nozzle tool 60 captured by board camera 71 of which the imaging target was exchange-use nozzle tool 60 stored in tool station 73.

With storage angle acquisition processing using the image of exchange-use nozzle tool 60, for example, the storage angle may be obtained by recognizing a view of the upper surface of nozzle tool 60. In the present embodiment, angle acquiring section 92 acquires the storage angle of nozzle tool 60 based on the position of a mark provided on the upper surface of nozzle tool 60 in the image of nozzle tool 60. This mark is information code Mn used in nozzle tool 60 recognition processing.

Further, in the present embodiment, as described above, exchange-use nozzle tool 60 is stored in tool station 73 at one of the two types of storage angles, An1 and An2. Thus, angle acquiring section 92 is able to acquire the storage angle by judging which of the two types of storage angle, An1 or An2, is applicable by recognizing the approximate position or direction (for example, the vertical direction of a 2D code) of information code Mn in the image. According to such a configuration, angle acquiring section 92 can acquire the storage angle without performing highly accurate image processing, thus reducing the processing load.

Exchange control section 93, during nozzle tool 60 exchange processing, raises and lowers tool holding device 51 to hold exchange-use nozzle tool 60 stored in tool station 73 in tool holding device 51, and aligns the angle of nozzle tool 60 with respect to head main body 41 by rotating tool holding device 51 based on storage angles An1 and An2 of the nozzle tool 60. Specifically, exchange control section 93 adjusts the relative angle of nozzle tool 60 with respect to head main body 41 such that nozzle lever 42 of head main body 41 passes through passage Pr of nozzle tool 60.

Further, exchange control section 93, during nozzle tool 60 exchange processing, controls operation of tool holding device 51 such that nozzle tool 60 is stored in tool station 73, from among the multiple types of the storage angles, at a storage angle for which the difference between the storage angle and the holding angle At of nozzle tool 60 aligned angularly with head main body 41 is minimized. Here, "holding angle" is the angle of nozzle tool 60 with respect to head main body 41 when performing angle alignment. Specifically, in the present embodiment, as shown in FIG. 6, holding angle At corresponds to an angle at which nozzle lever 42 can pass through passage Pr.

Exchange control section 93, in a case in which this holding angle At is equal to one of the two types of storage angles, An1 and An2, stores nozzle tool 60 at the equal storage angle. Further, exchange control section 93, in a case in which this holding angle At is not equal to one of the two types of storage angles, An1 and An2, stores nozzle tool 60 at the storage angle that is closer to holding angle At. Accordingly, the amount that nozzle tool 60 is rotated until reaching the storage angle after nozzle lever 42 has passed through passage Pr is reduced.

4. Nozzle Tool Exchange Processing

Figure 10:
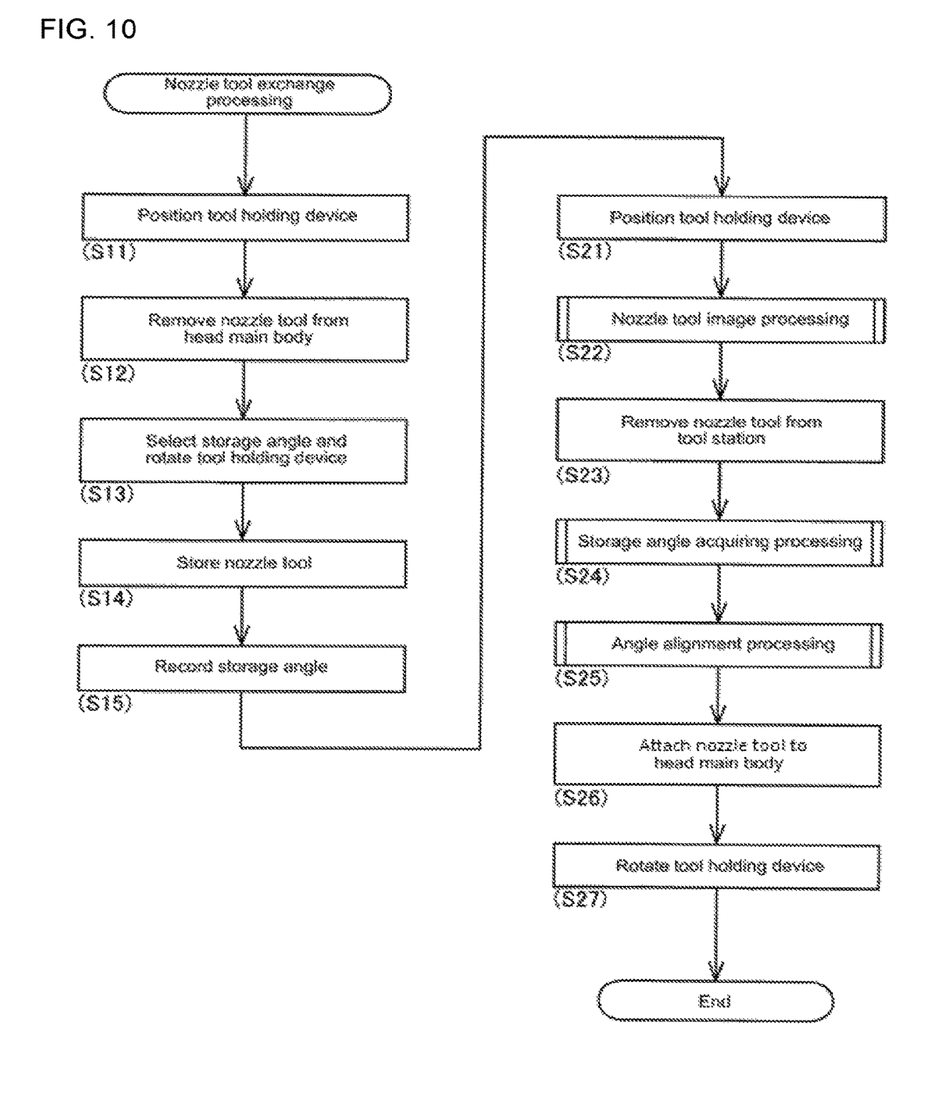
FIG. 10 is a flowchart showing exchange processing.

Control device 90 of component mounter 1 performs exchange processing to automatically exchange nozzle tool 60 according to the mounting data and state and so on of suction nozzle 66. During nozzle tool 60 exchange processing, first, control section 90 moves head unit 33 to tool station 73. By this, as shown in FIG. 10, control device 90 positions tool holding device 51 that holds nozzle tool 60 above an empty slot 80 in tool station 73 (step 11 [below step is abbreviated to S]).

Next, exchange control section 93 controls R-axis motor 45 to adjust the angle such that passage Pr of nozzle tool 60 and nozzle lever 42 of head main body 41 are positioned at the same position around the R axis. Then, exchange control section 93 lowers tool holding device 51 such that nozzle lever 42 passes through passage Pr. In this manner, exchange control section 93 separates the clutch section of θ-axis driven gear 55 and the clutch section of θ-axis cylindrical gear 64, thus removing nozzle tool 60 from head main body 41 (S12).

Continuing, exchange control section 93, from among first storage angle An1 and second storage angle An2 at which nozzle tool 60 can be stored in the above empty slot 80, selects the storage angle closest to holding angle At of nozzle tool 60. Then, exchange control section 93 controls operation of tool holding device 51 such that nozzle tool 60 is rotated by the difference between the selected storage angle and holding angle At (S13). Specifically, exchange control section 93 controls operation of R-axis motor 54 such that indexing shaft 52 holding nozzle tool 60 is positioned at a specified angle.

Here, first storage angle An1 and holding angle At are taken to be the same. Exchange control section 93 controls operation of tool holding device 51 to equal first storage angle An1. That is, exchange control section 93 controls operation of R-axis motor 54 such that holding angle of nozzle tool 60 is maintained. Therefore, in the present embodiment, rotation of nozzle tool 60 is not performed in step S13.

Exchange control section 93 further lowers tool holding device 51 such that nozzle tool 60 is stored in empty slot 80 of tool station 73. At this time, pin section 67 of nozzle tool 60 is inserted into hole section 81 of slot 80 at tool station 73. By this, angle determining mechanism Ca configured from hole section 81 and pin section 67 becomes engaged, and nozzle tool 60 is stored at first storage angle An1 (S14).

Control device 90, in a state with nozzle tool 60 loaded in slot 80, releases the clamping mechanism of indexing shaft 52, and raises tool holding device 51. By this, tool holding device 51 is separated from nozzle tool 60. Control device 90, for the nozzle tool 60 stored in nozzle station 73 due to the processing of S11 to S14, creates a link with the number of slot 80 and storage angle An1, and memorizes the information on a memory device (S15).

Continuing, control device 90 moves head unit 33 and positions tool holding device 51 above slot 80 in which is stored the next exchange-use nozzle tool 60 (S21). Here, control device 90 images exchange-use nozzle tool 60 in a state stored in slot 80 using board camera 71, acquires an image of the nozzle tool 60, and memorizes it in a memory device (S22).

Exchange control section 93 lowers tool holding device 51 such that indexing shaft 52 is inserted inside θ-axis cylindrical gear 64 of nozzle tool 60. After this, exchange control section 93 operates clamp mechanism of indexing shaft 52 such that exchange-use nozzle tool 60 is held by tool holding device 51. Then, exchange control section 93 raises tool holding device 51 to remove nozzle tool 60 from tool station 73 (S23).

Angle acquiring section 92 acquires the storage angle of nozzle tool 60 held by tool holding device 51 (S24). Specifically, angle acquiring section 92 acquires the storage angle of nozzle tool 60 based on the position of an information code provided on the upper surface of nozzle tool 60 in the image of exchange-use nozzle tool 60 acquired by the image processing of S22.

In the present embodiment, nozzle tool 60 is stored in tool station 73 at one of first storage angle An1 and second storage angle A2. Therefore, angle acquiring section 92 is able to acquire the storage angle of nozzle tool 60 by recognizing the approximate position of the information code in the image of nozzle tool 60. Here, exchange-use nozzle tool 60 is that stored at second storage angle An2.

Next, exchange control section 93 rotates tool holding device 51 based on storage angle An2 of nozzle tool 60 that was acquired in S24, and performs angle alignment of nozzle tool 60 with respect to head main body 41 (S25). Here, because storage angle An2 is 180 degrees deviated from holding angle At of nozzle tool 60, exchange control section 93 rotates indexing shaft 52 holding nozzle tool 60 180 degrees. Accordingly, the relative angle of nozzle tool 60 with respect to nozzle lever 42 is adjusted such that nozzle lever 42 of head main body 41 and passage Pr of nozzle tool 60 are in the same position around the R axis (refer to FIG. 6).

Then, exchange control section 93 raises tool holding device 51 such that nozzle lever 42 passes through passage Pr. By this, the clutch section of θ-axis cylindrical gear 64 and the clutch section of θ-axis cylindrical gear 64 are connected. In this manner, exchange control section 93 attaches exchange-use nozzle tool 60 to head main body 41 (S26). Continuing, exchange control section 93 rotates indexing shaft 52 such that roller 44 of head main body 41 is positioned centrally with respect to the circumferential width direction of first lever engaging member 63A. By this, first lever engaging member 63A becomes engaged with the engaging groove formed by nozzle lever 42 and roller 44.

As described above, control device 90 exchanges nozzle tool 60 by performing storage processing (S11 to S15) and attachment processing (S21 to S27) for nozzle tool 60. Control device 90 performs storage processing for nozzle tool 60 when performing exchange processing of nozzle tool 60 again. At this time, exchange control section 93, without going to the original storage angle, An2, of nozzle tool 60 (acquired in S24), selects first storage angle An1 for which the angular difference is smaller out of the two types of storage angles An1 and An2 based on holding angle At, and stores nozzle tool 60 in nozzle station 73 (S13, S14).

5. Effects of Embodiments

Component mounter 1 of the present embodiment includes: component transfer device 30 configured to detachably hold nozzle tool 60 to which suction nozzle 66 is attached, move nozzle tool 60, and transfer an electronic component held by suction nozzle 66 to a mounting position on circuit board Bd; tool station 73 configured to store exchange-use nozzle tool 60; and control device 90 configured to control operation of component transfer device 30 and perform mounting processing of the electronic component and exchange processing of nozzle tool 60. Component transfer device 30 includes head main body 41, and tool holding device 51 configured to hold nozzle tool 60 and provided to be raisable and lowerable with respect to head main body 41 and rotatable around a rotation axis line. Tool station 73 is configured to be able to store exchange-use nozzle tool 60 at multiple different storage angles, An1 and An2. Control device 90 is provided with angle acquiring section 92 configured to acquire the storage angle (An1, An2) of exchange-use nozzle tool 60 in tool station 73, and exchange control section 93 configured to, during the exchange processing of nozzle tool 60, raise and lower tool holding device 51 such that exchange-use nozzle tool 60 stored in tool station 73 is held by tool holding device 51, rotate tool holding device 51 based on the storage angle (An1, An2) of nozzle tool 60, and perform angle alignment of nozzle tool 60 with respect to head main body 41.

According to such a configuration, tool station 73 is configured to be capable of storing exchange-use nozzle tool 60 at multiple different storage angles, An1 and An2. Thus, the degree of freedom of setting the storage angle An1 and An2 of exchange-use nozzle tool 60 stored in tool station 73 is improved. Further, in exchange processing of nozzle tool 60, exchange control section 93 performs angle alignment of nozzle tool 60 with respect to head main body 41 based on the storage angle (S25). Thus, it is possible to perform highly effective nozzle tool 60 exchange processing appropriate to tool station 73.

Also, tool station 73 is able to store exchange-use nozzle tool 60 at multiple different storage angles, An1 and An2. Therefore, it is possible to hold nozzle tool 60 in tool station 73 at a storage angle (in the present embodiment, first storage angle An1) that corresponds to holding angle At of nozzle tool 60 that has been angularly aligned with respect to head main body 41. By this, during nozzle tool 60 exchange processing, it is possible to make the rotation angle of nozzle tool 60 required for angle alignment of nozzle tool 60 zero or a small angle. By this, efficiency of nozzle tool 60 exchange processing is improved.

Further, component mounter 1 also includes angle determining mechanism Ca that allows nozzle tool 60 stored in tool station 73 to be raised and lowered, and regulates the rotation around the rotation axis line of nozzle tool 60 with respect to tool station 73. Angle determining mechanism Ca allows nozzle tool 60 to be stored in tool station 73 at predetermined multiple types of storage angles (An1 and An2).

According to such a configuration, tool station 73 stores nozzle tool 60 in one of the multiple types of storage angles, An1 and An2, using angle determining mechanism Ca. By this, compared to a configuration in which nozzle tool 60 is stored in tool station 73 at any angle, acquiring storage angle An1 or An2 using angle acquiring section 92 of control device 90 is easy. Therefore, efficiency of nozzle tool 60 exchange processing is improved.

Also, angle determining mechanism Ca includes multiple hole sections 81 and 82 arranged at different positions on the rotation axis line of nozzle tool 60 stored in tool station 73 provided on one of tool station 73 and nozzle tool 60, and pin section 67 that enters the multiple hole sections 81 or 82 provided on the other of tool station 73 and nozzle tool 60. Angle determining mechanism Ca, by pin section 67 being selectively inserted into one of the multiple hole sections 81 and 82, regulates the rotation of nozzle tool 60 around the rotation axis line with respect to tool station 73 to storage angles An1 and An2 that correspond to the positional relationship between pin section 67 and hole sections 81 and 82.

According to such a configuration, tool station 73 sets the multiple types of storage angles, An1 and An2, based on the relationship between pin section 67 and the multiple hole sections 81 and 82. Thus, angle determining mechanism Ca, with a relatively simple configuration, reliably regulates the rotation around the rotation axis line of exchange-use nozzle tool 60 with respect to tool station 73. Further, by setting hole sections 81 and 82, it is easy to set multiple types of storage angles, An1 and An2.

Further, exchange control section 93, during nozzle tool 60 exchange processing, controls operation of tool holding device 51 such that nozzle tool 60 is stored in tool station 73, from among the multiple types of the storage angles, An1 and An2, at a storage angle for which the difference between the storage angle and the holding angle At of nozzle tool 60 aligned angularly with head main body 41 is minimized.

According to such a configuration, during nozzle tool 60 exchange processing, nozzle tool 60 is stored in tool station 73 at a storage angle (in the present embodiment, first storage angle An1) that corresponds to holding angle At with respect to head main body 41. By this, it is possible to make the rotation angle required when tool holding device 51 stores nozzle tool 60 zero or a small angle. By this, efficiency of nozzle tool 60 exchange processing is improved.

Further, control device 90, during electronic component mounting processing, controls the position of suction nozzle 66 based on an image of board Bd captured by board camera 71 provided on component transfer device 30. Angle acquiring section 92 acquires the storage angle (An1, An2) of nozzle tool 60 based on an image of nozzle tool 60 captured by board camera 71 of which the imaging target was exchange-use nozzle tool 60 stored in tool station 73.

According to such a configuration, angle acquiring section 92 acquires the storage angle (An1, An2) of exchange-use nozzle tool 60 based on an image of nozzle tool 60 captured by board camera 71 with nozzle tool 60 as an imaging target. In this manner, by using board camera 71 that is already provided it is possible to acquire the storage angle (An1, An2) of nozzle tool 60, therefore there is no need to arrange a new camera or sensor, thus contributing to a large reduction in costs.

Further, angle acquiring section 92 acquires the storage angle (An1, An2) of nozzle tool 60 based on the position of a mark provided on the upper surface of nozzle tool 60 in the image of nozzle tool 60. The mark has information including an identification number and type of nozzle tool 60, and is information code Mn used in recognition processing of nozzle tool 60.

According to such a configuration, angle acquiring section 92 recognizes information code Mn used to identify nozzle tool 60 by image processing, and acquires the collect angle (in the present embodiment, first storage angle An1) of exchange-use nozzle tool 60. Information code Mn is provided within the field of vision of board camera 71 due to being on the upper surface of nozzle tool 60. Also, identification code Mn is a characteristic portion on the upper surface of nozzle tool 60. Because angle acquiring section 92 is able to acquire the storage angle (An1, An2) of nozzle tool 60 by making use of information code Mn that is already provided, there is no need to arrange a new camera or sensor, thus contributing to a large reduction in costs.

Alternative Embodiment

Tool Station

In the present embodiment, angle determining mechanism Ca is configured from multiple hole sections 81 and 82 provided on tool station 73, and pin section 67 provided on nozzle tool 60. However, angle determining mechanism Ca may be configured by providing multiple hole sections of nozzle tool 60, and a pin section on tool station 73.

Further, angle determining section Ca may include multiple sections arranged at regular intervals on a circumferential direction, and multiple pin sections, the same quantity as the hole sections, arranged at even intervals in a circumferential direction. With such a configuration, each pin enters one of the hole sections based on the storage angle. Further, angle determining mechanism Ca may employ various configurations other than hole sections and pin sections, so long as the configuration allows engagement around the rotation axis line of nozzle tool 60.

Also, tool station 73 does not have to include angle determining mechanism Ca, nozzle tool 60 may be stored at any angle. For such a configuration, the degree of freedom of setting the storage angle of exchange-use nozzle tool 60 stored in tool station 73 is improved. On the other hand, for storage angle acquiring processing (S24), a certain level of accuracy is required. Thus, from the point of view of reducing the processing burden in storage angle acquiring processing (S24), the configuration of the present embodiment is suitable.

Information Code Mn and Storage Angle Acquiring Processing

In the present embodiment, the mark in the image of nozzle tool 60 used by angle acquiring section 92 to acquire the storage angle is information code Mn used in recognition processing of nozzle tool 60. For this information code Mn, a 2D code or barcode may be used. Also, the above mark may be configured from something other than an information code, for example, an information label with identification information included in a character string.

Further, in the present embodiment, tool station 73 is configured such that nozzle tool 60 can be stored at two types of storage angles, An1 and An2. Therefore, in recognition processing of nozzle tool 60, supposing, for example, that nozzle tool 60 is stored at first storage angle An1, the position of board camera 71 is controlled so as to image information code Mn affixed at a specified position on nozzle tool 60 when stored at first storage angle An1.

Here, control device 90, in a case in which information code Mn is not included in the captured image, decides that nozzle tool 60 is stored at second storage angle An2. Then, board camera 71 is moved to a position so as to image information code Mn affixed at a specified position on nozzle tool 60 when stored at second storage angle An2.

Here, angle acquiring section 92 is able to acquire the storage angle of nozzle tool 60 by checking the operation log during such recognition processing of nozzle tool 60. Thus, in exchange processing of nozzle tool 60, it is possible to read the storage angle from the memory device of control device 90 without performing imaging processing of nozzle tool 60 (S22).

Further, angle acquiring section 92 may use various methods other than of image of nozzle tool 60 captured by board camera 71 during storage angle acquiring processing (S24). For example, the configuration may be such that a sensor that detects the storage angle is provided on tool station 73, and angle acquiring section 92 acquires the storage angle based on an output value of the sensor, or instead of reusing an image of nozzle tool 60 captured by board camera 71, angle acquiring section 92 may be provided with a dedicated camera optimized for imaging the upper surface of nozzle tool 60. The same effects are achieved with such configurations as with the configuration of the first embodiment.

REFERENCE SIGNS LIST

1: component mounter; 10: board conveyance device; 20: component supply device; 30: component transfer device; 40: mounting head; 41: head main body; 51: tool holding device; 60: nozzle tool; 66: suction nozzle; 67: pin section (angle determining mechanism); 71: board camera; 72: nozzle station; 73: nozzle station; 80: slot; 81, 82: hole section (angle determining mechanism); 90: control device; 92: angle acquiring section; 93: exchange control section; Bd: board; Pr: passage; Ca: angle determining mechanism; Mn: identification code (mark); An1, An2: storage angle; At: holding angle

The invention claimed is:

1. A component mounter comprising:
   a component transfer device configured to detachably hold a held nozzle tool to which a suction nozzle is attached, move the nozzle tool, and transfer an electronic component held by the suction nozzle to a mounting position on a circuit board;
   a tool station configured to store an exchange-use nozzle tool; and
   a control device configured to control operation of the component transfer device and perform mounting processing of the electronic component and exchange processing of the held nozzle tool, wherein
   the component transfer device is provided with a head main body, and a tool holding device configured to hold the held nozzle tool and provided to be raisable and lowerable with respect to the head main body and rotatable around a rotation axis line,
   the tool station is configured to be able to store the exchange-use nozzle tool at multiple different storage angles, and
   the control device is provided with an angle acquiring section configured to acquire a storage angle of the exchange-use nozzle tool in the tool station, and an exchange control section configured to, during the exchange processing, raise and lower the tool holding device to remove the exchange-use nozzle tool stored in the tool station and to hold the exchange-use nozzle tool on the tool holding device, and configured to rotate the tool holding device based on the storage angle of the exchange-use nozzle tool to perform angle alignment of the exchange-use nozzle tool with respect to the head main body.

2. The component mounter according to claim 1, further comprising:
   an angle determining mechanism configured to allow raising and lowering of the exchange-use nozzle tool stored in the tool station and to regulate rotation of the exchange-use nozzle tool with respect to the tool station around the rotation axis line, wherein the angle determining mechanism allows the exchange-use nozzle tool to be stored in the tool station at multiple types of storage angles that are predetermined.

3. The component mounter according to claim 2, wherein the angle determining mechanism is provided with multiple hole sections provided on one of the tool station and the exchange-use nozzle tool at different positions around the rotation axis line of the exchange-use nozzle tool stored in the tool station, and a pin section provided on the other of the tool station and the exchange-use nozzle tool configured to be inserted into the multiple holes sections, wherein the rotation of the exchange-use nozzle tool around the rotation axis line is regulated with respect to the tool station at a storage angle corresponding to a positional relationship between the hole sections and the pin section by the pin section being selectively inserted into any of the multiple hole sections.

4. The component mounter according to claim 2, wherein the exchange control section, during the exchange processing, controls operation of the tool holding device to store the held nozzle tool in the tool holding device, from among the multiple types of the storage angles, at a storage angle at which a difference between the storage angle and the holding angle of the held nozzle tool angularly aligned with the head main body is minimized.

5. The component mounter according to claim 1, wherein the control device, during the mounting processing of the electronic component, controls the position of the suction nozzle based on an image of the board captured by a board camera provided on the component transfer device, and the angle acquiring device is configured to acquire the storage angle of the exchange-use nozzle tool based on an image of the exchange-use nozzle tool captured by the board camera, an imaging target of the board camera being the exchange-use nozzle tool stored in the tool station.

6. The component mounter according to claim 5, wherein the angle acquiring section is configured to acquire the storage angle of the exchange-use nozzle tool based on a position of a mark provided on an upper surface of the exchange-use nozzle tool shown in the image of the exchange-use nozzle tool, wherein the mark has information including an identification number and type of the exchange-use nozzle tool, the mark being an information code used in identification processing of the exchange-use nozzle tool.

* * * * *